US012757390B2

(12) United States Patent
Zin et al.

(10) Patent No.: US 12,757,390 B2
(45) Date of Patent: Oct. 6, 2026

(54) ANTIFUSES CAPABLE OF FORMING LOCALIZED CONDUCTIVE LINKS

(71) Applicant: GlobalFoundries Singapore Pte. Ltd., Singapore (SG)

(72) Inventors: Zar Lwin Zin, Singapore (SG); Shyue Seng Tan, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 426 days.

(21) Appl. No.: 18/479,816

(22) Filed: Oct. 2, 2023

(65) Prior Publication Data

US 2025/0113483 A1 Apr. 3, 2025

(51) Int. Cl.
*H10B 20/25* (2023.01)

(52) U.S. Cl.
CPC .................................... *H10B 20/25* (2023.02)

(58) Field of Classification Search
CPC ...................................................... H10B 20/25
See application file for complete search history.

(56) References Cited

U.S. PATENT DOCUMENTS 4,322,822 A * 3/1982 McPherson ............ G11C 17/16 365/182
5,726,484 A * 3/1998 Hart .................... H10W 20/491 257/209
2007/0257331 A1 11/2007 Kurjanowicz et al.

FOREIGN PATENT DOCUMENTS

CN 1309016 C * 4/2007

OTHER PUBLICATIONS

S. Migita, Y. Morita, T. Matsukawa, M. Masahara and H. Ota, "Experimental Demonstration of Ultrashort-Channel (3 nm) Junctionless FETs Utilizing Atomically Sharp V-Grooves on SOI," in IEEE Transactions on Nanotechnology, vol. 13, No. 2, pp. 208-215, Mar. 2014, doi: 10.1109/TNANO.2013.2296893.

Migita, Shinji & Morita, Yukinori & Masahara, Meishoku & Ota, Hiroyuki. (2013). Fabrication and Demonstration of 3-nm-Channel-Length Junctionless Field-Effect Transistors on Silicon-on-Insulator Substrates Using Anisotropic Wet Etching and Lateral Diffusion of Dopants. Japanese Journal of Applied Physics, vol. 52, No. 4S; DOI: 10.7567/JJAP.52.04CA01.

* cited by examiner

*Primary Examiner* — Edward Chin
(74) *Attorney, Agent, or Firm* — David Cain

(57) ABSTRACT

The embodiments herein relate to antifuses capable of forming localized conductive links and methods of forming the same. An antifuse is provided. The antifuse includes a substrate, a dielectric liner, and an electrode. The substrate includes a conductor layer, and a trench is in the conductor layer. The trench includes a first conductor surface and a second conductor surface. The dielectric liner is in the trench. The electrode is on the dielectric liner in the trench, and the electrode includes a first electrode surface and a second electrode surface converging to the first electrode surface.

20 Claims, 3 Drawing Sheets

ANTIFUSES CAPABLE OF FORMING LOCALIZED CONDUCTIVE LINKS

TECHNICAL FIELD

The present disclosure relates generally to antifuses, and more particularly to antifuses capable of forming localized conductive links and methods of forming the same.

BACKGROUND

An antifuse is a device that operates as a one-time programmable non-volatile memory element. Unlike conventional fuses designed to be blown or permanently open, antifuses are initially non-conductive but can be permanently transformed or programmed into conductive elements through a controlled process.

The working principle of an antifuse involves a dielectric material between two electrodes. Initially, the dielectric material serves as an electrical insulator to electrically isolate the two electrodes. When a programming electrical signal is applied across the antifuse, the dielectric material experiences a controlled breakdown and the antifuse undergoes a permanent physical or chemical change by forming a conductive link between the two conductive layers, effectively programming the antifuse to become permanently conductive.

However, the conductive link may be randomly formed within the dielectric material, thereby subjecting the antifuse to undesirable device-to-device variability with lower device performance and/or yield. Therefore, solutions are provided to overcome, or at least ameliorate, the disadvantages described above.

SUMMARY

To achieve the foregoing and other aspects of the present disclosure, antifuses capable of forming localized conductive links and methods of forming the same are presented.

According to an aspect of the present disclosure, an antifuse is provided. The antifuse includes a substrate, a dielectric liner, and an electrode. The substrate includes a conductor layer, and a trench is in the conductor layer. The trench includes a first conductor surface and a second conductor surface. The dielectric liner is in the trench. The electrode is on the dielectric liner in the trench, and the electrode includes a first electrode surface and a second electrode surface converging to the first electrode surface.

According to another aspect of the present disclosure, an antifuse is provided. The antifuse includes a substrate, a dielectric liner, and an electrode. The substrate includes a conductor layer, and a trench is in the conductor layer. The trench includes a first conductor surface and a second conductor surface. The dielectric liner is in the trench. The electrode is on the dielectric liner in the trench, and the electrode includes a first electrode surface and a second electrode surface converging to the first electrode surface. A conductive link extending through the dielectric liner is between the conductor layer and the electrode.

According to yet another aspect of the present disclosure, a method of forming an antifuse is provided. The method includes forming a conductor layer in a substrate and forming a trench in the conductor layer. A dielectric liner is formed conforming lining the trench. An electrode is formed on the dielectric liner and the electrode includes a first electrode surface and a second electrode surface converging to the first electrode surface.

BRIEF DESCRIPTION OF THE DRAWINGS

The embodiments of the present disclosure will be better understood from a reading of the following detailed description, taken in conjunction with the accompanying drawings.

Figure 1A:
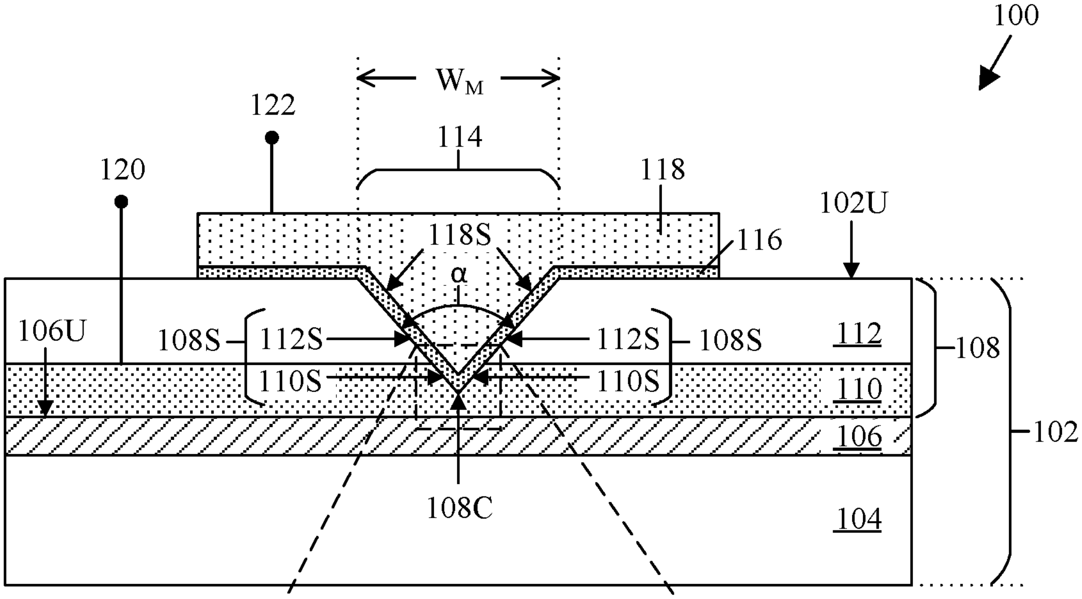
FIG. 1A is a cross-sectional view of an antifuse before programming and FIG. 1B is a cross-sectional view of an enlarged portion of the antifuse after programming, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure. Additionally, features in the drawings are not necessarily drawn to scale. For example, the dimensions of some of the features in the drawings may be exaggerated relative to other features to help improve the understanding of the embodiments of the device. The same reference numerals in different drawings denote the same features, while similar reference numerals may, but do not necessarily, denote similar features.

DETAILED DESCRIPTION

The present disclosure relates to antifuses capable of forming localized conductive links and methods of forming the same. Various embodiments of the present disclosure are now described in detail with accompanying drawings. It is noted that like and corresponding features are referred to by the use of the same reference numerals. The embodiments disclosed herein are exemplary, and not intended to be exhaustive or limiting to the disclosure.

Figure 1B:
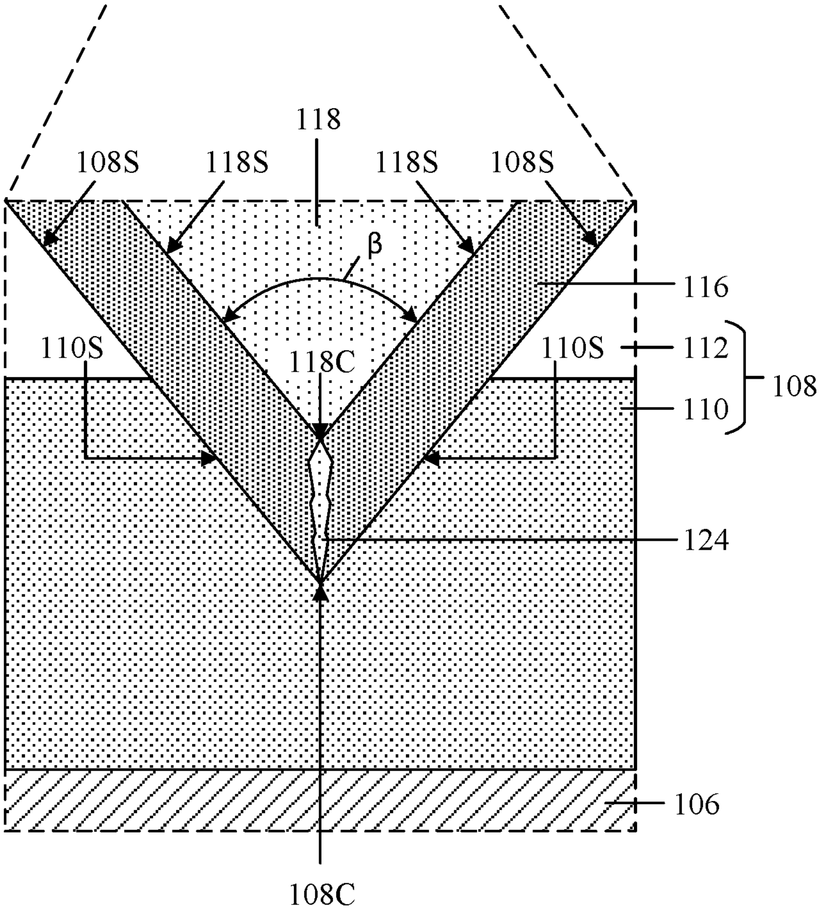

FIG. 1A is a cross-sectional view of an antifuse 100 before programming and FIG. 1B is a cross-sectional view of an enlarged portion of the antifuse 100 after programming, according to an embodiment of the disclosure. The antifuse 100 may include a substrate 102 having an upper substrate surface 102U. For purposes of description, the substrate 102 is illustrated and described as a composite semiconductor substrate, such as a semiconductor-on-insulator (SOI) substrate. The substrate 102 may include a base substrate layer 104, a buried insulator layer 106 over the base substrate layer 104, and a semiconductor layer 108 over the buried insulator layer 106. The semiconductor layer 108 may sometimes be referred to as an SOI layer, a device layer, or an active layer. The base substrate layer 104 and the semiconductor layer 108 may include a semiconductor material, such as monocrystalline silicon, silicon germanium, silicon carbide, or other II-VI or III-V semiconductor compounds, though not necessarily the same semiconductor material. The base substrate layer 104 may be doped or undoped. The buried insulator layer 106 may serve to isolate the semiconductor layer 108 from the base substrate layer 104 at least electrically. The buried insulator layer 106 may include an electrically insulative material, for example, silicon oxide or aluminum oxide, and may sometimes be referred to as a buried oxide (BOX) layer.

The substrate 102 may include a conductor layer 110 that is electrically conductive, for example, the conductor layer 110 may be a doped portion of the semiconductor layer 108 containing a concentration of ion species, for example, n-type or p-type dopants. The designation of "n-type" or "p-type" is based on the type of dopant and its conductivity. For example, n-type dopants may provide n-type conductivity and may include arsenic, phosphorus, or antimony, and p-type dopants may provide p-type conductivity and may include boron, aluminum, or gallium.

As illustrated in FIG. 1A, the semiconductor layer 108 may further include an undoped semiconductor layer 112 over the conductor layer 110, and the conductor layer 110 may be in direct contact with the buried insulator layer 106. In another embodiment of the disclosure, the undoped semiconductor layer 112 may be under the conductor layer 110. In yet another embodiment of the disclosure, the conductor layer 110 may extend in a vertical direction over a full thickness of the semiconductor layer 108 to the buried insulator layer 106, in other words, the semiconductor layer 108 may be fully doped. In this embodiment, the semiconductor layer 108 may have a substantially uniform dopant concentration extending from the upper substrate surface 102U to the buried insulator layer 106.

The substrate 102 may include a trench 114 extending downwardly from the upper substrate surface 102U. The trench 114 may extend partially through and terminate within the semiconductor layer 108 such that a portion of the semiconductor layer 108 may be between the trench 114 and the buried insulator layer 106, and the semiconductor layer 108 remains continuous. Additionally, the trench 114 may extend partially through and terminate within the conductor layer 110. The trench 114 may be defined by side surfaces 108S of the semiconductor layer 108; the side surfaces 108S extending downwardly from the upper substrate surface 102U into the semiconductor layer 108 towards the buried insulator layer 106. The side surfaces 108S of the semiconductor layer 108 may each include at least a conductor surface 110S of the conductor layer 110. For example, as illustrated in FIG. 1A, the side surfaces 108S of the semiconductor layer 108 may each include the conductor surface 110S of the conductor layer 110 and a semiconductor surface 112S of the undoped semiconductor layer 112.

The trench 114 may have varying widths between the side surfaces 108S of the semiconductor layer 108. For example, the side surfaces 108S of the semiconductor layer 108 may converge in a direction towards the buried insulator layer 106 and the trench 114 may have a decreasing width with increasing depth from the upper substrate surface 102U. In another example, the trench 114 may have a maximum width $W_M$ at a plane coplanar with the upper substrate surface 102U, and the width may decreasingly taper towards the buried insulator layer 106.

The side surfaces 108S of the semiconductor layer 108 may converge to and adjoin at a corner 108C, and the corner 108C may be substantially pointed. For example, the side surfaces 108S may adjoin at an angle $\alpha$ of at most 90 degrees. In an embodiment of the disclosure, the angle $\alpha$ may be a right angle, i.e., an angle at 90 degrees. In another embodiment of the disclosure, the angle $\alpha$ may be an acute angle, i.e., an angle of less than 90 degrees. In particular, as illustrated, it is the conductor surfaces 110S of the conductor layer 110 that form the corner 108C since the trench 114 may extend partially through and terminate within the conductor layer 110. In an embodiment of the disclosure, the corner 108C may be pointed towards the base substrate layer 104.

The side surfaces 108S of the semiconductor layer 108 may acquire a V-shaped profile and may sometimes be referred to as a V-groove. In this embodiment of the disclosure, the side surfaces 108S of the semiconductor layer 108 may be straight with a substantially uniform gradient. For example, the width of the trench 114 may decrease with increasing depth from the upper substrate surface 102U based on a linear function to provide a triangular shape. In another embodiment of the disclosure, the side surfaces 108S of the semiconductor layer 108 may converge in a non-linear function towards the buried insulator layer 106 and may adjoin to form a substantially rounded corner, for example, the side surfaces acquire a U-shaped profile.

The antifuse 100 may further include a dielectric liner 116 and an electrode 118. The dielectric liner 116 may be conformal and continuous, at least lining the trench 114. For example, the dielectric liner 116 may include a portion lining the side surfaces 108S of the semiconductor layer 108 and another portion outside the trench 114 over the upper substrate surface 102U. Alternatively, the dielectric liner 116 may be fully contained within the trench 114. The dielectric liner 116 may directly contact the side surfaces 108S of the semiconductor layer 108, including the conductor surfaces 110S of the conductor layer 110. In an embodiment of the disclosure, the dielectric liner 116 may have a substantially uniform thickness. The dielectric liner 116 may include an electrically insulative material including an oxide and/or a nitride, for example, silicon oxide, silicon nitride, or silicon oxynitride. The choice of thickness and the material of the dielectric liner 116 may depend on factors such as breakdown voltage, electrical insulation performance, process compatibility, and the overall performance goals of the antifuse 100.

The electrode 118 may be arranged over the dielectric liner 116 and may at least completely occupy the remaining portion of the trench 114, for example, a lower portion of the electrode 118 may be in the trench 114 forming a tapered portion and an upper portion may be outside the trench 114 over the dielectric liner 116. Alternatively, the electrode 118 may be fully contained in the trench. The lower portion of the electrode 118 may include electrode surfaces 118S that may be in direct contact with the dielectric liner 116 and each electrode surface 118S may be substantially parallel to the nearest side surface 108S of the semiconductor layer 108, including the conductor surface 110S of the conductor layer 110.

The electrode surfaces 118S may converge to and adjoin at a corner 118C, and the corner 118C may be substantially pointed. For example, the electrode surfaces 118S may adjoin at an angle $\beta$ and the angle $\beta$ may be substantially equal to the angle $\alpha$ formed by the side surfaces 108S of the semiconductor layer 108, including the conductor surface 110S of the conductor layer 110. The corner 118C may be substantially vertically over the corner 108C of the semiconductor layer 108 and may be the nearest point of the electrode 118 to the corner 108C of the semiconductor layer 108. In an embodiment of the disclosure, the corner 118C may be pointed towards the base substrate layer 104.

The lower portion of the electrode 118 may have varying widths between the electrode surfaces 118S. For example, the electrode surfaces 118S may converge in a direction towards the buried insulator layer 106, and the lower portion of the electrode 118 may have a decreasing width with increasing depth from the upper portion thereof. In another example, the lower portion of the electrode 118 may have a maximum width adjoining with the upper portion thereof and the width may decreasingly taper towards the corner 108C of the semiconductor layer 108. The electrode 118 may include an electrically conductive material that is different from the conductor layer 110, for example, polycrystalline silicon. In an embodiment of the disclosure, the corner 118C of the electrode 118 may partially extend downwardly into and terminate within the conductor layer 110 of the substrate 102. In another embodiment of the disclosure, only a portion of the dielectric liner 116 partially extends into the conductor layer 110, and the corner 118C of the electrode 118 is over the conductor layer 110 of the substrate 102.

The conductor layer 110 and the electrode 118 may serve as electrodes of the antifuse 100 and may be electrically connected to terminals 120, 122, respectively. The terminals 120, 122 may provide electrical signals that may be used to program the antifuse 100 as required. Without an application of a sufficiently large electrical signal, the dielectric liner 116 remains robust and the antifuse 100 remains in a non-conductive state as the dielectric liner 116 electrically isolates the conductor layer 110 and the electrode 118. When a sufficiently large electrical signal is applied to the antifuse 100, the antifuse 100 may be programmed by a formation of a permanent conductive link 124 in the dielectric liner 116 between the conductor layer 110 and the electrode 118, as illustrated in FIG. 1B. In this embodiment of the disclosure, the antifuse 100 may provide one (1) bit cell per device.

During the application of a sufficiently large electrical signal, localized charge concentrations may be formed at a region around the corner 118C of the electrode 118 due to stronger electrical fields concentrated around the corner 118C. This eventually results in the breakdown of the dielectric liner 116 within the region and the formation of the conductive link 124 in the dielectric liner 116. The formation of the conductive link 124 may be due to, for example, material diffusion or electromigration of atoms or ions of the electrically conductive material of the electrode 118. Electrical signals may thereafter pass through the permanent conductive link 124, transforming the antifuse 100 from a non-conductive state to a permanently conductive state. In an embodiment of the disclosure, the permanent conductive link 124 may be formed extending from the corner 118C of the electrode 118 towards the conductor layer 110.

Although not illustrated in the accompanying drawings, the antifuse 100 may optionally include an opening in the trench 114 through the electrode 118, for example, the opening may be substantially vertically over the corner 108C of the semiconductor layer 108. The opening may separate the electrode 118 into disconnected electrode sections, and a portion of the dielectric liner 116 may be exposed in the opening, between the electrode sections. Each electrode section may be laterally adjacent to and spaced apart from each other. Each electrode section may include a corner formed by the electrode surface 118S and a side surface (not shown) of the electrode section in the trench 114. The electrode sections may be electrically connected to separate terminals for the programming of the antifuse 100. In this embodiment, the antifuse 100 may provide two (2) bit cells per device.

The corner 118C of the electrode 118 advantageously improves the device performance of the antifuse 100. Electric fields generated at corners or pointed regions of conductive structures may be relatively stronger than that of non-corner regions, for example, stronger electric fields may be localized around the corner 118C of the electrode 118. Therefore, during a program operation, the formation of the conductive link 124 may be substantially confined to a region in the dielectric liner 116 that is nearest to the corner 118C of the electrode 118 that may be experiencing relatively stronger electric fields compared to substantially straight, non-corner side surfaces. The ability to control and substantially confine the formation of the conductive link 124 to a defined region may be advantageous to minimize the variability of locations where the conductive link 124 may be formed. The conductive link 124 may not randomly form within the dielectric liner 116 but rather at selected regions, for example, regions subjected to the stronger electric fields. Such controlled distribution of the conductive link 124 may enhance the device performance and reduce the device-to-device variability of the antifuse 100.

Figure 2A:
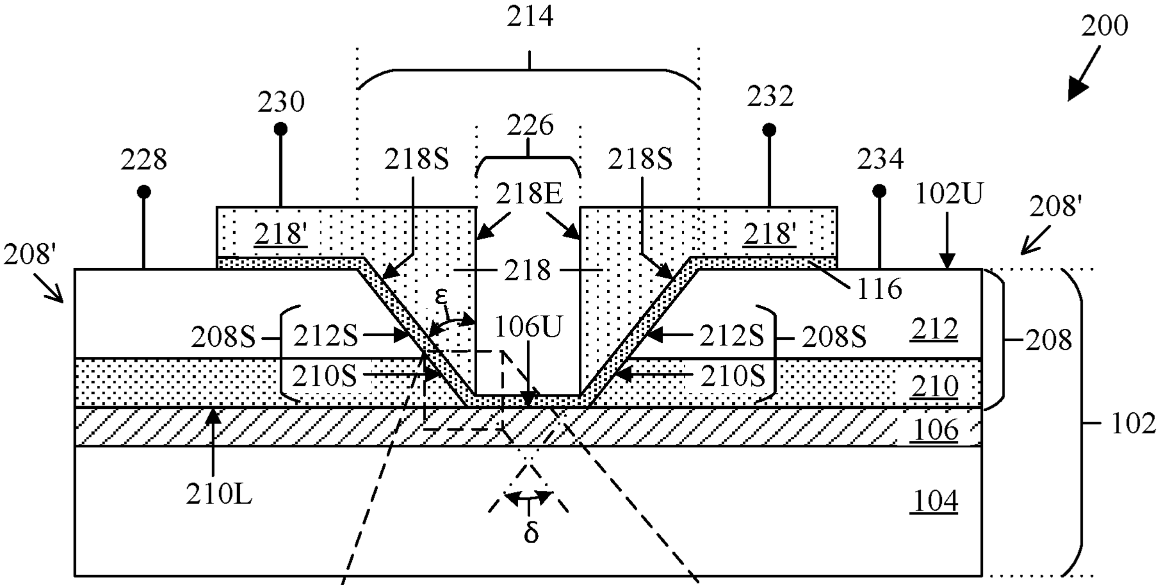
FIG. 2A is a cross-sectional view of an antifuse before programming and FIG. 2B is a cross-sectional view of an enlarged portion of the antifuse after programming, according to another embodiment of the disclosure.
Figure 2B:
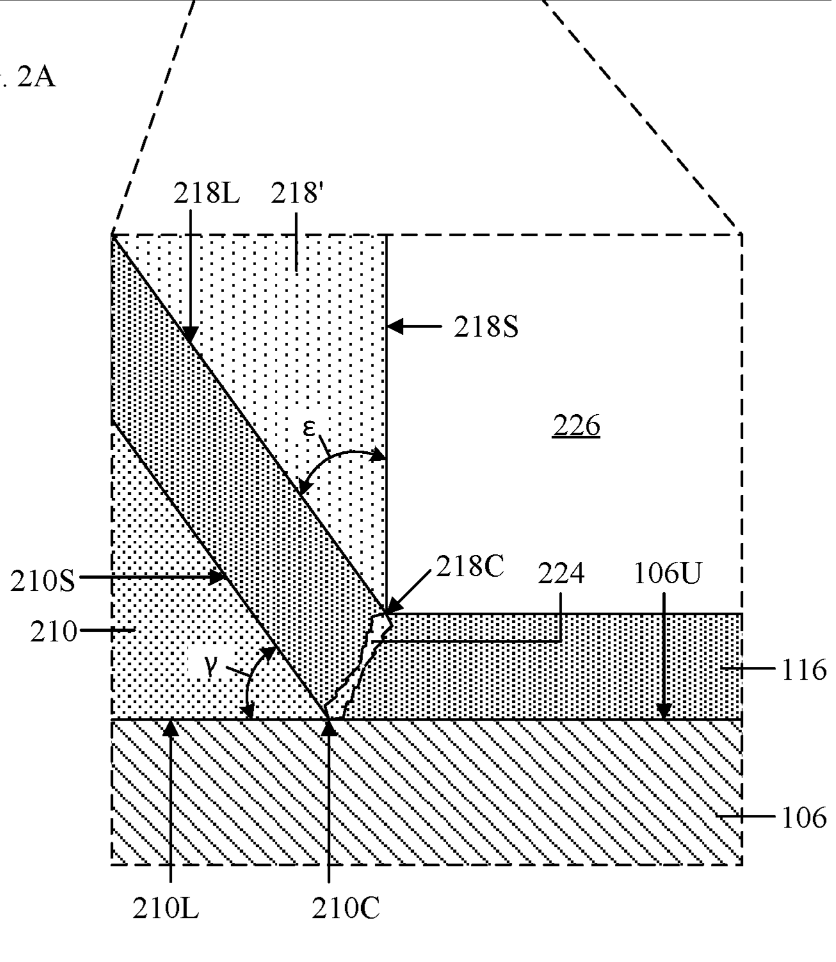

FIG. 2A is a cross-sectional view of an antifuse 200 before programming and FIG. 2B is a cross-sectional view of an enlarged portion of the antifuse 200 after programming, according to another embodiment of the disclosure. The antifuse 200 may be similar to the antifuse 100 in FIG. 1A, and thus, common features are labeled with the same reference numerals.

Similar to the antifuse 100 in FIG. 1A, the antifuse 200 may include a substrate 102 having an upper substrate surface 102U. The substrate 102 may include, for example, a composite substrate having a buried insulator layer 106 interposed between a base substrate layer 104 and a semiconductor layer 208. The semiconductor layer 208 may be synonymous with the semiconductor layer 108 and may include a semiconductor material, such as monocrystalline silicon, silicon germanium, silicon carbide, or other II-VI or III-V semiconductor compounds.

The antifuse 200 may further include a conductor layer 210 in the substrate 102. The conductor layer 210 may be synonymous with the conductor layer 110 in FIG. 1A. The conductor layer 210 may be a doped portion of the semiconductor layer 208. The conductor layer 210 may be in direct contact with the buried insulator layer 106. The antifuse 200 may further optionally include an undoped semiconductor layer 212 over the conductor layer 210. The undoped semiconductor layer 212 may be synonymous with the undoped semiconductor layer 112 in FIG. 1A.

The substrate 102 may include a trench 214 extending downwardly from the upper substrate surface 102U. The trench 214 may be arranged in the semiconductor layer 208, extending downwardly from the upper substrate surface 102U. The trench 214 may be defined by side surfaces 208S of the semiconductor layer 208. The side surfaces 208S of the semiconductor layer 208 may converge in a direction towards the buried insulator layer 106, with a decreasing width with increasing depth from the upper substrate surface 102U. The side surfaces 208S of the semiconductor layer 208 may each include at least a conductor surface 210S of the conductor layer 210. For example, as illustrated in FIG. 2A, the side surfaces 208S of the semiconductor layer 208 may each include the conductor surface 210S of the conductor layer 210 and a semiconductor surface 212S of the undoped semiconductor layer 212.

However, unlike the trench 114 in FIG. 1A, the trench 214 may extend through the semiconductor layer 208, dividing the semiconductor layer 208 into disconnected semiconductor sections 208'. Accordingly, the conductor layer 210 and the undoped semiconductor layer 212 may be divided into disconnected sections by the trench 214. The side surfaces 208S of the semiconductor layer 208 may be spaced apart from each other and each terminating on the buried insulator layer 106, exposing an upper surface 106U of the buried insulator layer 106 in the trench 214. Each semiconductor section 208' may additionally include a lower surface 210L of the conductor layer 210, which may be synonymous with a lower surface of the semiconductor layer 108. The lower surface 210L of the conductor layer 210 may be in direct contact with the buried insulator layer 106, and the lower surface 210L and the conductor surface 210S may converge to and adjoin at a corner 210C having an acute angle γ, the corner 210C may be substantially pointed.

The antifuse 200 may also include a dielectric liner 116 and an electrode 218 over the dielectric liner 116. The dielectric liner 116 may be conformal and continuous, at least lining the trench 214. For example, the dielectric liner 116 may directly contact the side surfaces 208S of the semiconductor layer 208, including the conductor surfaces 210S of the conductor layer 210, and the upper surface 106U of the buried insulator layer 106 in the trench 214 between the semiconductor sections 208'.

The electrode 218 may be synonymous with the electrode 118 in FIG. 1A, and the electrode 218 may be arranged over the dielectric liner 116 in at least the trench 214. The electrode 218 may include at least a portion in the trench 214. For example, as illustrated in FIG. 2A, the electrode 218 may include a lower portion in the trench 114 forming a tapered portion and an upper portion may be outside the trench 214 over the dielectric liner 116. Alternatively, the electrode 218 may be fully contained in the trench 214. The electrode 218 may include an electrically conductive material that is different from the conductor layer 210, for example, polycrystalline silicon.

However, unlike the antifuse 100, the electrode 218 may not completely occupy the trench 214 but instead partially fills the remaining portion. An opening 226 may be arranged in the trench 214 through the electrode 218, dividing the electrode 218 into disconnected electrode sections 218'. A portion of the dielectric liner 116 may be exposed in the opening 226. Each electrode section 218' may be laterally adjacent to and spaced apart from each other.

Each electrode section 218' may be arranged at least over each semiconductor section 208'. Each electrode section 218' may include an electrode surface 218S on or in direct contact with the dielectric liner 116 and each electrode surface 218S may be substantially parallel to the nearest side surface 208S of the semiconductor layer 208, including the conductor surface 210S of the conductor layer 210. The electrode surfaces 218S may converge to form an angle δ that may be a right angle, i.e., an angle at 90 degrees, or an acute angle, i.e., an angle of less than 90 degrees, as illustrated in FIG. 2A. The electrode surfaces 218S may also not adjoin each other. Each electrode section 218' may further include an end surface 218E in the trench 214; the end surfaces 218E of the electrode sections 218' may define the width of the opening 226 in the trench 214. In an embodiment of the disclosure, the end surfaces 218E of the electrode sections 218' are substantially vertically straight.

The end surface 218E and the electrode surface 218S of each electrode section 218' may converge to and adjoin at a corner 218C having an acute angle ε, and the corner 218C may be substantially pointed. The corner 218C may be arranged at a lateral offset from the corner 210C, and the corner 218C may be the nearest point of the electrode section 218' to the corner 210C. In an embodiment of the disclosure, the corner 218C may be pointed towards the base substrate layer 104.

Each semiconductor section 208' and each electrode section 218' may be electrically connected to respective terminals 228, 230, 232, 234 that provide electrical signals that may be used to program the antifuse 200 as required. Without an application of a sufficiently large electrical signal, the dielectric liner 116 remains robust and the antifuse 200 remains in a non-conductive state as the dielectric liner 116 electrically isolates the semiconductor sections 208' from the electrode sections 218'.

When a sufficiently large electrical signal is applied to the antifuse 200, a permanent conductive link 224 may be formed in a region of the dielectric liner 116 between the semiconductor sections 208' and their nearest electrode sections 218' proximate to the corner 210C and the corner 218C. The conductive link 224 may be formed due to, for example, material diffusion or electromigration of atoms or ions of the electrically conductive materials of the conductor layer 210 and/or the electrode 218. Electrical signals may thereafter pass through the permanent conductive link 224, transforming or programming the antifuse 200 from a non-conductive state to a permanently conductive state. In an embodiment of the disclosure, the permanent conductive link 224 may include a portion extending from the corner 218C towards the corner 210C and/or another portion extending from the corner 210C towards the corner 218C. Accordingly, the conductive link 224 may include materials from the conductor layer 210 and/or the electrode 218. In this embodiment, the antifuse 200 may provide two (2) bits per device that can be programmed independently.

Figure 3:
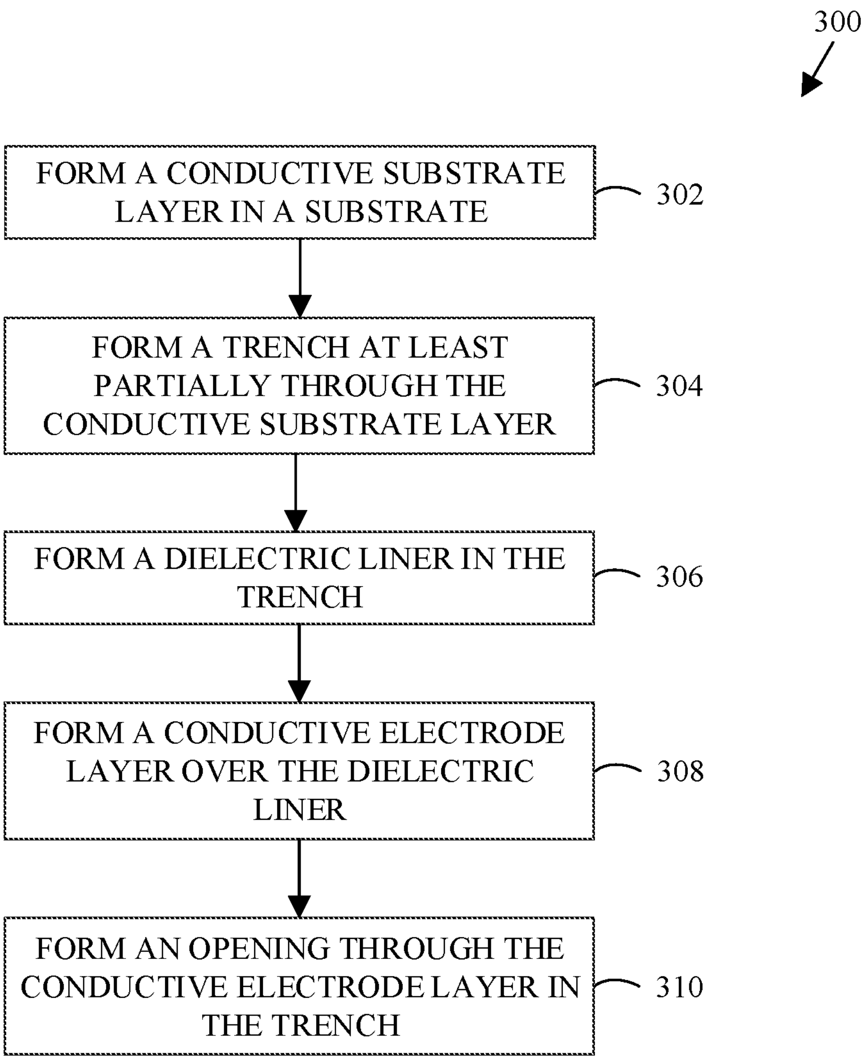
FIG. 3 is a flowchart 300 illustrating a method of forming an antifuse, according to an embodiment of the disclosure.

FIG. 3 is a flowchart 300 illustrating a method of forming an antifuse, according to an embodiment of the disclosure. The method may be used for the formation of the antifuse 100 of FIG. 1A or the antifuse 200 of FIG. 2A. Certain structures may be fabricated, for example, using known processes and techniques, and specifically disclosed processes and methods may be used to achieve individual aspects of the present disclosure. The below-described order for the method of forming the antifuse is intended to be illustrative, and the method is not limited to the specifically described order unless otherwise specifically stated.

As used herein, "deposition techniques" refer to the process of applying a material over another material. Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), or atomic layer deposition (ALD).

Additionally, "patterning techniques" include deposition of material or photoresist, patterning, exposure, development, etching, cleaning, and/or removal of the material or photoresist as required in forming a described pattern, structure, or opening. Exemplary examples of techniques for patterning include, but not limited to, wet etch photolithographic processes, dry etch photolithographic processes, or direct patterning processes.

A substrate may be provided. The substrate may be a composite semiconductor substrate, such as a semiconductor-on-insulator (SOI) substrate including a base substrate layer, a buried insulator layer over the base substrate layer, and a semiconductor layer over the buried insulator layer. The substrate may be synonymous with the substrate 102 in FIGS. 1A and 2A. The base substrate layer and the buried insulator layer may be synonymous with the base substrate layer 104 and the buried insulator layer 106, respectively, in FIGS. 1A and 2A, and the semiconductor layer may be synonymous with the semiconductor layer 108 in FIG. 1A and the semiconductor layer 208 in FIG. 2A. The base substrate layer and the semiconductor layer may include a semiconductor material, such as monocrystalline silicon, silicon germanium, silicon carbide, or other II-VI or III-V semiconductor compounds, though not necessarily the same semiconductor material. The buried insulator layer may include an electrically insulating material, for example, silicon oxide or aluminum oxide A conductive substrate layer may be formed in the substrate, as illustrated by operation 302. The conductive substrate layer may be synonymous with the conductor layer 110 in FIG. 1A or the conductor layer 210 in FIG. 2A. The conductive substrate layer may be formed by a doping technique, including an ion implantation process, using ion species, for example, n-type or p-type dopants. The process conditions (e.g., ion species, dose, kinetic energy) may be selected to tune the electrical and physical characteristics of the conductive substrate layer.

A trench may be formed in the substrate 102 at least partially through the conductive substrate layer, as illustrated by operation 304. The trench may be synonymous with the trench 114 in FIG. 1A or the trench 214 in FIG. 2A. The trench may be formed by a patterning technique, including lithography and etching processes to remove a portion of the semiconductor layer of the substrate. The trench may extend downwardly from the upper substrate surface and terminate partially within the conductive substrate layer, similar to the trench 114 in FIG. 1A or may extend through the conductive substrate layer, similar to the trench 214 in FIG. 2A.

A dielectric liner may be formed in the trench, as illustrated by operation 306. The dielectric liner 116 may be synonymous with the dielectric liner 116 in FIGS. 1A and 2A. The dielectric liner 116 may be formed by a deposition technique, including a conformal CVD process or an ALD process. The dielectric liner may be conformal and continuous, at least lining the trench, overlaying at least the side surfaces of the semiconductor layer. The dielectric liner may directly contact the side surfaces of the semiconductor layer. The dielectric liner may include an electrically insulating material including an oxide and/or a nitride, for example, silicon oxide, silicon nitride, or silicon oxynitride.

A conductive electrode may be formed over the dielectric liner, as illustrated by operation 308. The conductive electrode may be synonymous with the electrode 118 in FIG. 1A or the electrode 218 in FIG. 2A. The electrode 118 may be formed by a deposition process, including a CVD process or a PVD process, to deposit a layer of conductive electrode material. The electrode 118 may at least occupy the trench. The conductive electrode may include an electrically conductive material that is different from the conductive substrate layer in the substrate, for example, polycrystalline silicon.

The dielectric liner and the electrode may be sequentially or concurrently patterned using a patterning technique, including lithography and etching processes. An opening may be optionally formed through the conductive electrode in the trench, as illustrated by operation 310. The opening may be synonymous with the opening 226 in FIG. 2A. The opening may be formed by a patterning technique, including lithography and etching processes. The opening may divide the conductive electrode into disconnected electrode sections, similar to the electrode sections 218' in FIG. 2A, and a portion of the dielectric liner may be exposed in the opening.

Processing continues with forming terminals electrically connected to the conductive substrate layer and the conductive electrode to provide electrical signals for the programming of the antifuse. Without an input of a sufficiently large electrical signal, the dielectric liner remains robust and the antifuse remains in a non-conductive state as the dielectric liner electrically isolates the conductive substrate layer from the conductive electrode.

A permanent conductive link may be formed in the dielectric liner between the conductive substrate layer from the conductive electrode when a sufficiently large electrical signal is applied to the antifuse. Accordingly, the antifuse has been transformed from a non-conductive state to a permanently conductive state as electrical signals may pass through the conductive link, electrically connecting the conductive substrate layer and the conductive electrode.

As presented above, various embodiments of antifuses and methods of forming the same are presented. The antifuses may be capable of forming localized conductive links in a dielectric liner between two electrodes. At least one electrode may include a corner and the corner may advantageously improve the device performance and reduce the device-to-device variability by substantially confining the formation of the conductive link to a region in the dielectric liner subjected to relatively stronger electrical fields.

The terms “top”, “bottom”, “over”, “under”, and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed by interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms “comprise”, “include”, “have”, and any variations thereof, are intended to cover a non-exclusive inclusion, such that a process, method, article, or device that comprises a list of features is not necessarily limited to those features but may include other features not expressly listed or inherent to such process, method, article, or device. Occurrences of the phrase “in an embodiment” herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term “about”.

Furthermore, approximating language, as used herein throughout the specification and claims, may be applied to modify any quantitative representation that could permissibly vary without resulting in a change in the basic function to which it is related. Accordingly, a value modified by a term or terms, such as “approximately”, “about,” or “substantially” is not limited to the precise value specified. In some instances, the approximating language may correspond to the precision of an instrument for measuring the value. In other instances, the approximating language may correspond to within normal tolerances of the semiconductor industry. For example, “substantially coplanar” means substantially in a same plane within normal tolerances of the semiconductor industry, and “substantially perpendicular” means at an angle of 90 degrees plus or minus a normal tolerance of the semiconductor industry.

While several exemplary embodiments have been presented in the above-detailed description of the device, it should be appreciated that a number of variations exist. It should further be appreciated that the embodiments are only examples, and are not intended to limit the scope, applicability, dimensions, or configuration of the device in any way. Rather, the above-detailed description will provide those skilled in the art with a convenient road map for implementing an exemplary embodiment of the device, it being understood that various changes may be made in the function and arrangement of features and methods of fabrication described in an exemplary embodiment without departing from the scope of this disclosure as set forth in the appended claims.

What is claimed is:

1. An antifuse, comprising:
- a substrate;
- a conductor layer of the substrate, the conductor layer being a monocrystalline semiconductor layer;
- a trench in the conductor layer, the trench including a first conductor surface and a second conductor surface;
- a dielectric liner in the trench; and
- an electrode on the dielectric liner in the trench, the electrode comprises a first electrode surface and a second electrode surface converging to the first electrode surface.

2. The antifuse of claim 1, wherein the first electrode surface and the second electrode surface converge at a first angle of at most 90 degrees.

3. The antifuse of claim 2, wherein the first electrode surface adjoins the second electrode surface at a corner.

4. The antifuse of claim 2, wherein the first conductor surface and the second conductor surface converge at a second angle substantially equal to the first angle.

5. The antifuse of claim 1, wherein the first electrode surface is substantially parallel to the first conductor surface.

6. The antifuse of claim 1, wherein the electrode and the conductor layer comprise an electrically conductive material, and the electrically conductive material of the electrode is different from the electrically conductive material of the conductor layer.

7. The antifuse of claim 1, wherein the electrode at least fully occupies the trench.

8. The antifuse of claim 1, wherein the substrate further comprises:
- a base substrate layer;
- a buried insulator layer over the base substrate layer; and
- a semiconductor layer over the buried insulator layer, wherein the conductor layer is a doped portion of the semiconductor layer.

9. The antifuse of claim 8, wherein a portion of the conductor layer is vertically between the trench and the buried insulator layer.

10. The antifuse of claim 8, wherein the trench extends through the conductor layer, and the first conductor surface is spaced apart from the second conductor surface.

11. The antifuse of claim 10, further comprising an opening in the electrode, wherein a portion of the dielectric liner is exposed in the opening.

12. The antifuse of claim 11, wherein the portion of the dielectric liner is directly in contact with the buried insulator layer.

13. The antifuse of claim 8, further comprising an undoped semiconductor layer in the semiconductor layer, and the doped conductor layer is between the undoped semiconductor layer and the buried insulator layer.

14. An antifuse, comprising:
- a substrate having an upper substrate surface;
- a conductor layer of the substrate, the conductor layer being a monocrystalline semiconductor layer;
- a trench in the conductor layer, the trench including a first conductor surface and a second conductor surface;
- a dielectric liner in the trench;
- an electrode on the dielectric liner in the trench, the electrode comprises a first electrode surface and a second electrode surface converging to the first electrode surface; and
- a conductive link between the conductor layer and the electrode, the conductive link extending through the dielectric liner.

15. The antifuse of claim 14, wherein the first electrode surface and the second electrode surface converge to a corner, and the conductive link extends from the corner.

16. The antifuse of claim 14, wherein the electrode comprises an electrically conductive material and the conductive link includes at least the electrically conductive material of the electrode.

17. The antifuse of claim 14, wherein the first conductor surface and the second conductor surface adjoin the first conductor surface at a first corner, the first electrode surface adjoins the second electrode surface at a second corner, and the second corner is vertically over the first corner.

18. The antifuse of claim 14, further comprising an opening in the electrode to divide the electrode into a first electrode section and a second electrode section, and a portion of the dielectric liner is exposed in the opening.

19. The antifuse of claim 18, wherein each electrode section includes the first electrode surface on the dielectric liner and an end surface in the trench, wherein the end surfaces of the electrode sections are substantially vertically straight.

20. A method of forming an antifuse, comprising:
- forming a trench in a conductor layer of a substrate, the conductor layer being a monocrystalline semiconductor layer;
- forming a dielectric liner conformal lining the trench; and
- forming an electrode on the dielectric liner, the electrode comprises a first electrode surface and a second electrode surface converging to the first electrode surface.

* * * * *